United States Patent
Sun et al.

(10) Patent No.: US 6,451,697 B1
(45) Date of Patent: *Sep. 17, 2002

(54) METHOD FOR ABRASIVE-FREE METAL CMP IN PASSIVATION DOMAIN

(75) Inventors: Lizhong Sun, Sunnyvale; Shijian Li, San Jose; Fritz Redeker, Fremont, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/544,281

(22) Filed: Apr. 6, 2000

(51) Int. Cl.$^7$ ................... H01L 21/302; H01L 21/461
(52) U.S. Cl. ................ 438/691; 438/645; 438/692; 438/693; 438/697; 438/745; 438/754
(58) Field of Search ............... 438/691, 692, 438/693, 745, 754, 697, 645, 690, 597, 631, 633

(56) References Cited

U.S. PATENT DOCUMENTS

| | | | |
|---|---|---|---|
| 4,169,337 A | 10/1979 | Payne | 51/283 R |
| 4,588,421 A | 5/1986 | Payne | 51/308 |
| 4,752,628 A | 6/1988 | Payne | 523/122 |
| 4,867,757 A | 9/1989 | Payne | 51/293 |
| 5,264,010 A | 11/1993 | Brancaleoni et al. | 51/308 |
| 5,614,444 A | 3/1997 | Farkas et al. | 437/225 |
| 5,700,383 A | * 12/1997 | Feller et al. | 438/645 |
| 5,738,574 A | 4/1998 | Tolles et al. | 451/288 |

(List continued on next page.)

FOREIGN PATENT DOCUMENTS

| | | | |
|---|---|---|---|
| EP | 0 659 858 | 6/1995 | C09G/1/02 |
| EP | 0 896 042 A1 | 2/1999 | C09G/1/02 |
| EP | 913 442 A2 | 5/1999 | |
| EP | 0 913 442 A2 | 6/1999 | C09G/1/02 |
| WO | WO9849723 | 11/1998 | |
| WO | WO 99/53532 | 10/1999 | H01L/21/00 |
| WO | WO 99/61540 | 12/1999 | C09G/1/02 |
| WO | WO 00/00561 | 1/2000 | C09G/1/02 |
| WO | WO 00/00567 | 1/2000 | C09K/3/14 |
| WO | WO 00/30159 | 5/2000 | H01L/21/00 |
| WO | WO 00/36037 | 6/2000 | C09G/1/02 |
| WO | WO 00/49647 | 8/2000 | H01L/21/302 |
| WO | WO 00/53691 | 9/2000 | C09K/3/14 |
| WO | WO 01/12739 A1 | 2/2001 | C09G/1/02 |

OTHER PUBLICATIONS

Brusic, V. et al, "Copper Corrosion With and Without Inhibitors", *Electrochem. Soc.*, 138:8, 2253–2259, Aug. 1991.

USSN Patent Application Publication, Michael R. Oliver, Publication No.: US 2001/0036798, Publication Date: Nov. 1, 2001, "Methods for Chemical–Mechanical Polishing of Semiconductor Wafers," Application No.: 09/833,309, Application Filed: Apr. 12, 2001.

Austrian Patent Office Search Report from 200006115–0, Dated Jun. 28 2001.

PCT International Search Report from PCT/US 01/11374, Dated Oct. 23, 2001.

*Primary Examiner*—Matthew Smith
*Assistant Examiner*—Igwe U. Anya
(74) *Attorney, Agent, or Firm*—Moser, Patterson & Sheridan

(57) ABSTRACT

Metal CMP with reduced dishing and overpolish insensitivity is achieved with an abrasive-free polishing composition having a pH and oxidation-reduction potential in the domain of passivation of the metal and, therefore, a low static etching rate at high temperatures, e.g., higher than 50° C. Embodiments of the present invention comprise CMP of Cu film without any abrasive using a composition comprising one or more chelating agents, one or more oxidizers, one or more corrosion inhibitors, one or more agents to achieve a pH of about 3 to about 10 and deionized water.

15 Claims, 3 Drawing Sheets

U.S. PATENT DOCUMENTS

| | | | |
|---|---|---|---|
| 5,738,800 A | 4/1998 | Hosali et al. | 216/99 |
| 5,756,398 A | 5/1998 | Wang et al. | 438/692 |
| 5,769,689 A | 6/1998 | Cossaboon et al. | 451/41 |
| 5,770,095 A | 6/1998 | Sasaki et al. | 216/38 |
| 5,840,629 A * | 11/1998 | Carpio | 438/692 |
| 5,866,031 A | 2/1999 | Carpio et al. | 252/79.1 |
| 5,876,508 A | 3/1999 | Wu et al. | 134/2 |
| 5,911,835 A | 6/1999 | Lee et al. | 134/1.3 |
| 5,932,486 A | 8/1999 | Cook et al. | 438/692 |
| 5,958,794 A | 9/1999 | Bruxvoort et al. | |
| 5,981,454 A | 11/1999 | Small | 510/175 |
| 5,985,748 A | 11/1999 | Watts et al. | 438/622 |
| 6,001,730 A | 12/1999 | Farkas et al. | 438/627 |
| 6,030,899 A | 2/2000 | Cook et al. | 438/692 |
| 6,033,993 A | 3/2000 | Love, Jr. et al. | 438/745 |
| 6,042,741 A | 3/2000 | Hosali et al. | 252/79.1 |
| 6,046,110 A | 4/2000 | Hirabayashi et al. | 438/693 |
| 6,054,379 A | 4/2000 | Yau et al. | 438/623 |
| 6,068,879 A | 5/2000 | Pasch | 427/97 |
| 6,074,949 A | 6/2000 | Schonauer et al. | 438/692 |
| 6,077,337 A * | 6/2000 | Lee | 438/693 |
| 6,083,840 A * | 7/2000 | Mravic et al. | 438/693 |
| 6,096,652 A * | 8/2000 | Watts et al. | 438/692 |
| 6,117,775 A * | 9/2000 | Kondo et al. | 438/690 |
| 6,117,783 A * | 9/2000 | Small et al. | 438/693 |
| 6,156,661 A | 12/2000 | Small | 438/692 |
| 6,194,317 B1 * | 2/2001 | Kaisaki et al. | 438/692 |
| 6,210,525 B1 | 4/2001 | James et al. | 156/345 |
| 6,217,416 B1 | 4/2001 | Kaufman et al. | 451/41 |
| 6,238,592 B1 | 5/2001 | Hardy et al. | 525/79.1 |
| 6,245,679 B1 | 6/2001 | Cook et al. | 438/692 |

* cited by examiner

METHOD FOR ABRASIVE-FREE METAL CMP IN PASSIVATION DOMAIN

TECHNICAL FIELD

The present invention relates generally to metal polishing and, particularly, to planarizing copper (Cu) and/or Cu alloy metallization in manufacturing semiconductor devices with reduced dishing and overpolish insensitivity. The present invention is applicable to manufacturing high speed integrated circuits having submicron design features and high conductivity interconnect structures with improved reliability.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance and capacitance) interconnect pattern, particularly wherein submicron vias, contacts and conductive lines have high aspect rations imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an action region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section. The entire opening is filled with a conductive material, typically a metal, to simultaneously form a conductive plug in electrical contact with a conductive line.

Cu and Cu alloys have received considerable attention as a candidate for replacing Al in interconnect metallizations. Cu is relatively inexpensive, easy to process, and has a lower resistivity than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), titanium-titanium nitride (Ti—TiN), titanium silicon nitride (TiSiN), tungsten silicon nitride (WSiN), tantalum silicon nitride (TaSiN) and silicon nitride for encapsulating Cu. The use of such barrier metals to encapsulate Cu is not limited to the interface between Cu and the dielectric interlayer, but includes interfaces with other metals as well.

In conventional CMP techniques, a wafer carrier assembly is in contact with a polishing pad in a CMP apparatus. The wafers are typically mounted on a carrier or polishing head which provides a controllable pressure urging the wafers against the polishing pad. The pad has a relative movement with respect to the wafer driven by an external driving force. Thus, the CMP apparatus effects polishing or rubbing movement between the surface of each thin semiconductor wafer and the polishing pad while dispersing a polishing slurry containing abrasive particles in a reactive solution to effect both chemical activity and mechanical activity while applying a force between the wafer and a polishing pad. A different type of abrasive article from the above-mentioned abrasive slurry-type polishing pad is fixed abrasive article, e.g., fixed abrasive polishing pad. Such a fixed abrasive article typically comprises a backing sheet with a plurality of geometric abrasive composite elements adhered thereto.

It is extremely difficult to planarize a metal surface, particularly a Cu surface, as by CMP of a damascene inlay, with a high degree of surface planarity. A dense array of Cu features is typically formed in an interlayer dielectric, such as a silicon oxide layer, by a damascene technique wherein trenches are initially formed. A barrier layer, such as a Ta-containing layer e.g., Ta, TaN, is then deposited lining the trenches and on the upper surface of the silicon oxide interlayer dielectric. Cu or a Cu alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8,000 Å to about 18,000 Å. CMP is then conducted to remove the Cu or Cu alloy overburden stopping on the barrier layer. Buffing is then conducted to remove the barrier layer, employing a mixture of a chemical agent and abrasive particles, leaving a Cu or the Cu alloy filling the damascene opening with an exposed surface. Overpolishing, as at about 10% to about 25%, is typically conducted beyond the time required to reach the interlayer dielectric, as determined by conventional end point detection techniques, e.g., to completely remove the barrier layer. For example, if 300 seconds of polishing are required to reach the targeted surface, 20% overpolishing would involve a total polishing time of 360 seconds. Conventional CMP techniques employing polishing pads utilizing slurries containing abrasive particles as well as CMP techniques employing fixed abrasive articles are characterized by excessive dishing sensitivity to overpolishing.

Dishing occurs wherein a portion of the surface of the inlaid metal of the interconnection formed in the groove in the interlayer dielectric is excessively polished resulting in one or more concavities or depressions. For example, adverting to FIG. 1, conductive lines 11 and 12 are formed by depositing a metal, such as Cu or a Cu alloy, in a damascene opening formed in interlayer dielectric 10, e.g., silicon dioxide. Subsequent to planarization, a portion of the inlaid metal 12 is depressed by an amount D referred to as the amount of dishing. For example, dishing occurring in metal lines, such as Cu or Cu alloy metal lines having a width of about 50 microns, generally exceeds 1,000 Å with as little overpolish as about 5% to about 10%.

Another phenomenon resulting from conventional planarization techniques is known as erosion which is characterized by excessive polishing of the layer not targeted for removal. For example, adverting to FIG. 2, metal line 21 and dense array of metal lines 22 are inlaid in interlayer dielectric 20. Subsequent to planarization, excessive polishing of the interlayer material results in erosion E.

Dishing disadvantageously results in a non-planar via that impairs the ability to print high resolution lines during subsequent photolithographic steps. Dishing can also cause the formation of shorts or open circuits in the metal interconnection formed thereover. Moreover, dishing increases with longer overpolishing than when overpolishing is conducted to ensure complete removal of the metal layer and/or barrier layer across the wafer surface.

Conventional CMP techniques employ abrasives, such as an abrasive-containing slurry for use on a conventional polishing pad. The use of abrasives disadvantageously results in a high degree of dishing and erosion, because of pressure transmitted through the abrasive particle to the metal. In addition, the use of abrasives significantly increases the cost of consumables, as abrasives and suspension agents, as well as post CMP effluent treatment, are expensive.

There exists a need for CMP methodology enabling the planarization of inlaid metal, particularly inlaid Cu metallization, with reduced dishing and insensitivity to overpolishing.

DISCLOSURE OF THE INVENTION

An aspect of the present invention is an efficient method of planarizing inlaid metals, such as Cu and Cu alloys, with significantly reduced dishing and significantly reduced sensitivity to overpolishing.

According to the present invention, the foregoing and other aspects are achieved in part by a method of removing at least part of a material, e.g., metal, from a substrate surface, the method comprising CMP the substrate surface using a composition having a pH and oxidation-reduction potential in the domain of passivation of the material.

Another aspect of the present invention is a method of manufacturing a semiconductor device, the method comprising planarizing a deposited Cu or Cu alloy layer on a dielectric layer by CMP employing a composition comprising: one or more chelating agents; one or more oxidizers, one or more corrosion inhibitors; one or more pH adjusting agents; and deionized water.

Embodiments of the present invention comprise CMP inlaid Cu metallization employing an abrasive-free polishing composition having a pH and oxidation-reduction potential in the domain of passivation of Cu and having a low static etching rate with respect to Cu. Embodiments of the present invention include polishing compositions comprising one or more chelating agents, such as ethylenediaminetetraacetic acid, ethylenediamine or methylformamide, one or more oxidizers, such as hydrogen peroxide, ferric nitrate or an iodate, one or more corrosion inhibitors, such as benzotriazole, mercaptobenzotriazole or 5-methyl-1-benzotriazole, one or more acids or bases sufficient to achieve a pH of about 3 to about 10, such as a pH of about 5 to about 8, e.g., an inorganic and/or organic acid, the remainder deionized water.

Additional aspects of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
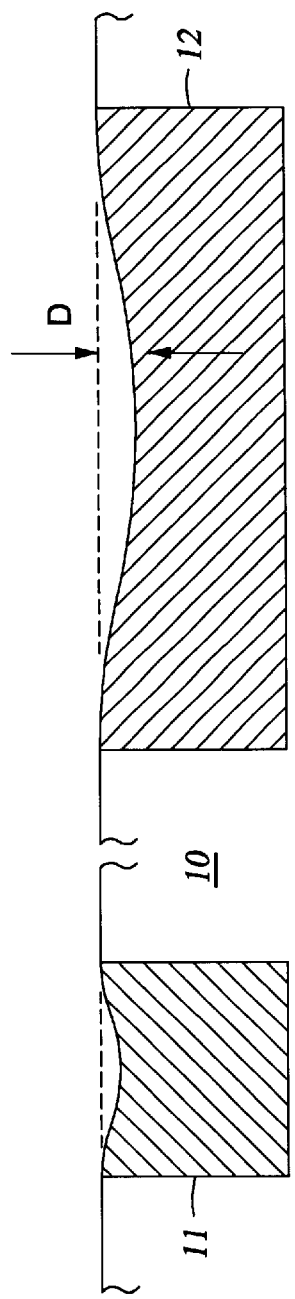
FIG. 1 schematically illustrates the phenomenon of dishing.
Figure 2:
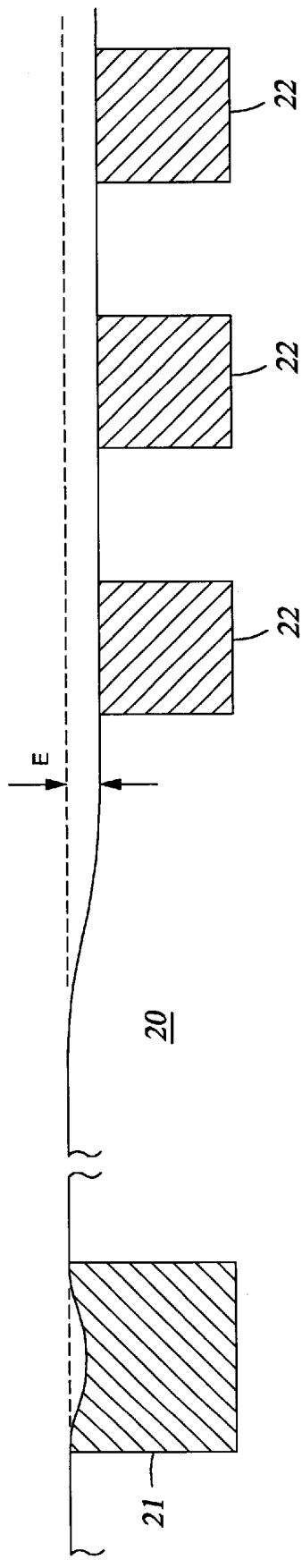
FIG. 2 schematically illustrates the phenomenon of erosion.
Figure 3:
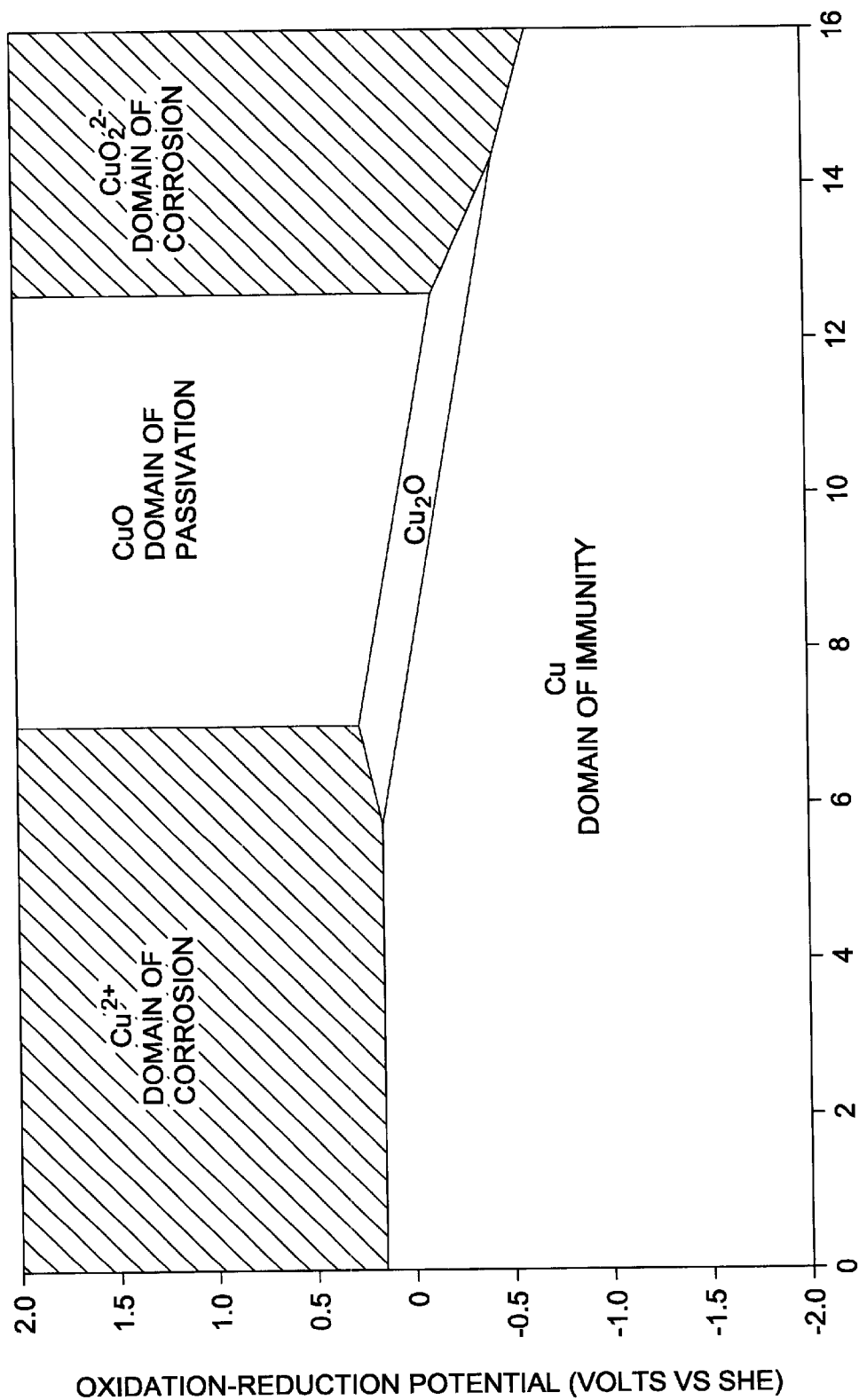
FIG. 3 is a pH-oxidation/reduction potential diagram for copper.

The present invention enables effective and efficient planarization of inlaid metal, e.g., Cu metallization, with significantly reduced dishing, erosion and overpolish sensitivity, thereby avoiding the disadvantages attendant upon forming a non-planar surface, such as a non-planar via. Such disadvantages include the impairment of the ability to print high resolution lines during photolithographic processing, and the formation of voids or open circuits in the interconnection formed thereover. Additional disadvantages attendant upon conventional CMP stem from the use of abrasives, either abrasive-containing slurries or fixed abrasive articles, which significantly increase dishing and erosion, and significantly increase the cost of CMP methodology. As used throughout this disclosure, the symbol Cu is intended to encompass high purity elemental copper as well copper-based alloys, e.g., copper-based alloys containing at least about 80 wt. % copper.

Aspects of the present invention are implemented by providing CMP methodology employing a polishing composition formulated to passivate metal films. Such polishing compositions exhibit a greatly reduced static etching rate, i.e., etching rate in the absence of mechanical abrasion, even at elevated temperatures, thereby reducing dishing and erosion.

Conventional CMP methodology employs polishing compositions require strong mechanic abrasive action which leads to excessive dishing and erosion. The present invention overcomes problems attendant upon high dishing, erosion and overpolishing sensitivity by providing CMP methodology employing polishing compositions which form a passivation film over the metal surface, e.g., Cu, thereby reducing the static etching rate. For example, conventional CMP methodology employing abrasive slurries exhibit a Cu static etching rate greater than 300 Å per minute at 52° C. and greater than 730 Å per minute at 52° C. for fixed abrasive copper CMP. Dishing in 50 micron conductive lines exceeds 1,000 Å with very little overpolish, e.g., about 5% to about 10%, due to abrasive particles.

In an embodiment of the present invention, CMP is conducted without an abrasive, as by employing an abrasive-free polishing composition with a conventional polishing pad, thereby significantly reducing dishing and erosion, and significantly reducing the cost of conducting CMP. Embodiments of the present invention also include CMP using the polishing compositions containing abrasive particles or with fixed abrasive articles. Polishing compositions suitable for use in practicing embodiments of the present invention include those disclosed in copending application Ser. No. 09/543,777, filed on Apr. 5, 2000. Such polishing compositions comprise one or more chelating agents, such as a chelating agent containing one or more amine or amide groups, e.g., ethylenediaminetetraacetic acid, ethylenediamine or methylformamide. The chelating agent can be present in a suitable amount, such as about 0.2 wt. % to about 3.0 wt. %. The compositions in accordance with the present invention further comprise one or more oxidizers, one or more corrosion inhibitors, one or more pH adjusting agents and deionized water. The oxidizer or oxidizers can be any of various conventional oxidizers employed in CMP, such as hydrogen peroxide, ferric nitride or an iodate, and can be present in a suitable amount, such as about 0.5 wt. % to about 8.0 wt. %. The corrosion inhibitor or inhibitors can comprise any various organic compounds containing an azole group, such as benzotriazole, mercaptobenzotriazole, or 5-methyl-1-benzotriazole, and can be present in a suitable amount, such as about 0.02 wt. % to about 1.0 wt. %. The pH adjusting agent or agents can be present in an amount for adjusting the pH of the composition to a range of about 3 to about 10 and can comprise any of various bases or inorganic and/or organic acids, such as acetic acid, phosphoric acid, or oxalic acid. Conventional abrasive particles can be incorporated in the polishing composition, e.g., in an amount up to about 10% wt. %, such as up to about 1.0 wt. %, e.g., up to about 0.1 wt. %.

Some embodiments of the present invention comprise CMP of Cu, with or without polishing a barrier layer. In CMP of Cu, it was found suitable to formulate the polishing composition such that it has a pH and oxidation-reduction potential in the domain of passivation of Cu.

Conventional substrates and interlayer dielectrics are encompassed by the present invention. For example, the substrate can be doped monocrystalline silicon or galliumarsenide. The interlayer dielectric can comprise any of various dielectric materials conventionally employed in the manufacture of semiconductor devices. For example, dielectric materials, such as silicon dioxide, phosphorous-doped silicon-glass (PSG), boron-phosphorous-doped silicon glass (BPSG) and silicon dioxide derived from tetraethyl orthosilicate (TEOS) or silane by plasma enhanced chemical vapor deposition (PECVD) can be employed. Interlayer dielectrics in accordance with the present invention can also comprise low dielectric constant materials, including polymers, such as polyamides, and carbon-containing silicon dioxide, e.g., Black Diamond dielectric available from Applied Materials, Inc., located in Santa Clara, Calif. The openings are formed in interlayer dielectrics by conventional photolithographic and etching techniques.

Advantageously, abrasive-free CMP methodology in accordance with an embodiment of the present invention can be employed with various commercial polishing pads. Optimum process parameters for CMP can be easily determined in a particular situation. For example, methodology in accordance with the abrasive-free CMP embodiment employs a polishing pressure of about 1 to about 8 psi, and a platen speed of about 20 to 120 rpm for a polishing duration of about 30 seconds to 2,000 seconds. Advantageously, the abrasive-free CMP embodiment can be employed to planarize any of various films such as metal films, e.g., tungsten, aluminum, titanium, titanium nitride and nickel.

Figure 4:
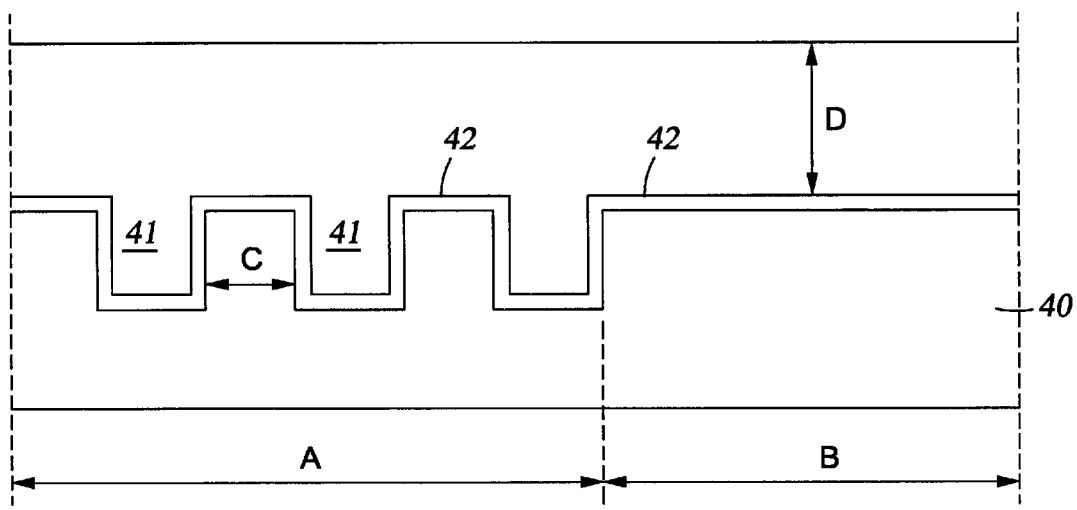
FIGS. 4–6 schematically illustrate sequential phases of a method in accordance with an embodiment of the present invention.
Figure 5:
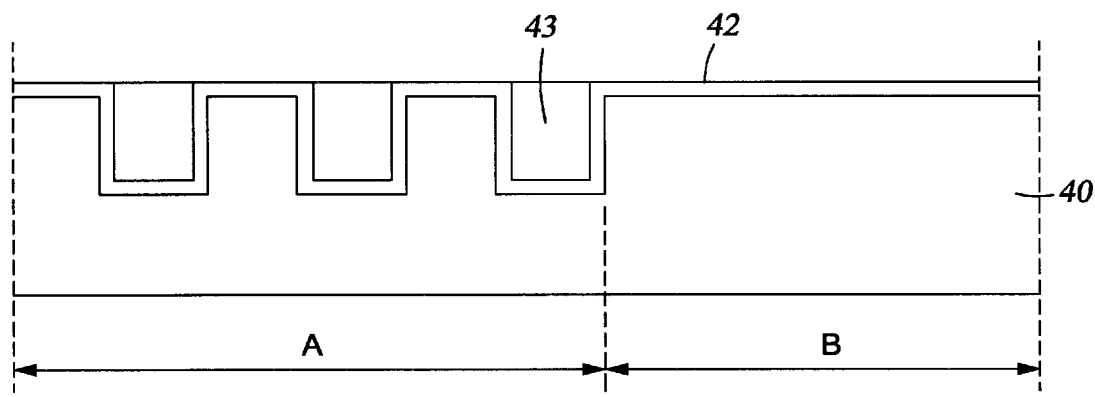
Figure 6:
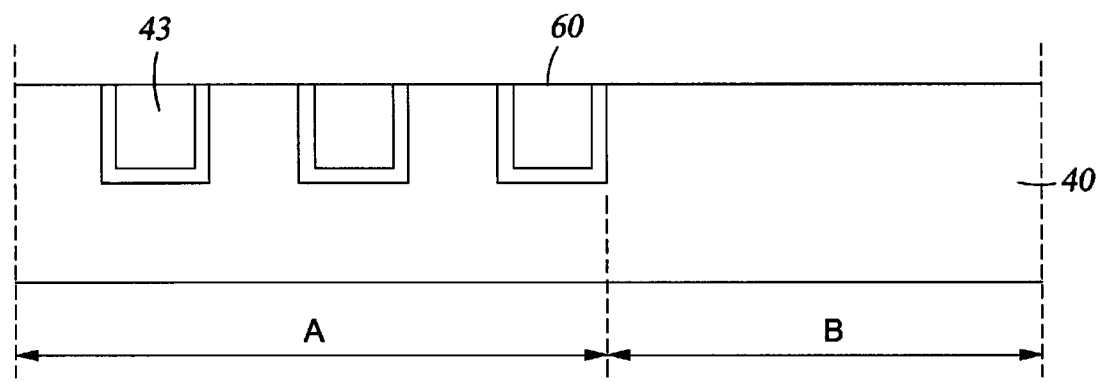

An embodiment of the present invention is schematically illustrated in FIGS. 4–6, wherein similar features bear similar reference numerals. Adverting to FIG. 4, interlayer dielectric 40, e.g., silicon oxide, is formed overlying a substrate (not shown). A plurality of openings 41 are formed in a designated area A in which a dense array of conductive lines are to be formed bordering an open field B. A barrier layer 42, e.g., TaN, is deposited lining the openings 41 and on the upper surface of silicon oxide interlayer dielectric 40. Typically, the openings 41 are spaced apart by a distance C which is less than about 1 micron, e.g., about 0.2 micron. Cu layer 43 is then deposited at a thickness D of about 8,000 Å to about 18,000 Å.

Adverting to FIG. 5, CMP is conducted employing an abrasive-free, noble polishing composition to remove the Cu overburden stopping on TaN barrier layer 42, employing a conventional end point detection technique, with significantly reduced dishing. As shown in FIG. 6, buffing is conducted and overpolishing, with reduced dishing. Alternatively CMP can be conducted in one stage to remove the Cu overburden with overpolishing, using the abrasive-free noble polishing composition, with reduced dishing and reduced sensitivity to overpolishing. The resulting Cu interconnection structure comprises a dense array A of Cu lines 43 bordered by open field B. However, the upper surface 60 of the Cu metallization exhibits significantly reduced dishing.

The present invention is applicable to planarizing a wafer surface during various stages of semiconductor manufacturing by any of various CMP techniques using any of various CMP systems and polishing articles, e.g., fixed abrasive- or abrasive slurry-type pads or sheets. The present invention enjoys particular applicability in the manufacture of high density semiconductor devices with metal features in the deep submicron range.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of removing at least a part of a copper-containing material from a substrate surface, the method comprising chemical-mechanical polishing (CMP) the substrate using an abrasive-free composition having a pH and oxidation-reduction potential in the domain of passivation of the copper-containing material, the composition comprising:

one or more chelating agents having one or more amine or amide groups selected from the group of ethylenediaminetetraacetic acid, ethylenediamine, methylformamide, and combinations thereof, wherein the one or more chelating agents comprise between 0.2 wt. % and about 3 wt. % of the abrasive-free composition;

one or more oxidizers;

one or more corrosion inhibitors; and deionized water.

2. The method according to claim 1, wherein the copper-containing material comprises copper (Cu) or a Cu alloy.

3. The method according to claim 2, wherein CMP is conducted at a pressure of about 1 to about 8 psi and a platen speed of about 20 to about 120 rpm for about 30 seconds to about 2,000 seconds.

4. The method according to claim 1, wherein the composition has a static etching rate of no greater than about 200 Å per minute at about 52° C.

5. The method according to claim 1, wherein the composition has a pH of about 3.0 to about 10.0.

6. The method according to claim 1, comprising planarizing a deposited copper or copper alloy layer on a dielectric layer with an abrasive-free composition having a pH and oxidation-reduction potential in the domain of passivation of the deposited copper or copper alloy layer at a static etching rate of no greater than about 200 Å per minute at about 52° C. and a pH of about 3.0 to about 10.0.

7. The method according to claim 6, wherein planarizing a deposited copper or copper alloy layer on a dielectric layer comprises:

forming an interlayer dielectric having at least one opening therein over the substrate;

depositing a barrier layer and copper or a copper alloy to fill the opening and form a layer on the interlayer dielectric; and CMP to remove the copper or copper alloy layer from the interlayer dielectric to form a planarized surface.

8. The method according to claim 7, wherein dishing is less than about 600 Å and erosion is less than about 50 Å at about 58% overpolishing.

9. The method according to claim 1, wherein the composition further removes materials selected from the group of aluminum, tungsten, titanium, titanium nitride, nickel, and combinations thereof.

10. The method of claim 1, wherein the composition further comprises one or more agents to adjust the pH.

11. A method of removing at least a part of a copper-containing material from a substrate surface, the method comprising:

forming an interlayer dielectric having at least one opening therein over the substrate;

depositing a barrier layer and a copper or a copper alloy on the barrier layer to fill the opening and form a layer on the interlayer dielectric; and chemical-mechanical polishing (CMP) the copper or copper alloy layer from the interlayer dielectric to form a planarized surface using an abrasive-free composition having a pH and oxidation-reduction potential in the domain of passivation of the copper-containing material, wherein the composition comprises between 0.2 wt. % and about 3.0 wt. % of one or more chelating agents comprising one or more compounds having one or more amine or amide groups, wherein the compounds are selected from the group of ethylenediaminetetraacetic acid, ethylenediamine, methylformamide, and combinations thereof, one or more oxidizers, one or more corrosion inhibitors, and deionized water.

12. The method of claim 11, wherein the composition further comprises one or more agents to adjust the pH.

13. The method of claim 11, wherein the composition has a static etching rate of no greater than about 200 Å per minute at about 52° C.

14. The method of claim 11, wherein the composition has a pH of about 3.0 to about 10.0.

15. The method of claim 11, wherein CMP is conducted at a pressure of about 1 to about 8 psi and a platen speed of about 20 to about 120 rpm for about 30 seconds to about 2,000 seconds.

* * * * *

UNITED STATES PATENT AND TRADEMARK OFFICE
CERTIFICATE OF CORRECTION

PATENT NO. : 6,451,697 B1
DATED : September 17, 2002
INVENTOR(S) : Lizhong Sun, Shijian Li and Fritz Redeker It is certified that error appears in the above-identified patent and that said Letters Patent is hereby corrected as shown below:

Column 1,
Line 22, replace "rations" with -- ratios --;

Column 2,
Line 26, after "e.g." insert -- a --;

Column 4,
Line 42, after "well" insert -- as --;
Line 52, should read -- positions and requires strong mechanical abrasive action which"; and Column 5,
Lines 42-43, should read -- substrate can be doped monocrystalline silcon or gallium-arsenide. The interlayer dielectric can comprise any of --.

Signed and Sealed this

Twenty-fourth Day of August, 2004

JON W. DUDAS
*Director of the United States Patent and Trademark Office*